(12) United States Patent
Bao

(10) Patent No.: US 8,120,723 B2
(45) Date of Patent: Feb. 21, 2012

(54) FLAT PANEL DISPLAY WITH U-SHAPED FASTENING MEMBER

(75) Inventor: Zhen-Yi Bao, Suzhou (CN)

(73) Assignees: AU Optronics (Suzhou) Corp., Ltd., Suzhou (CN); AU Optronics Corporation, Hsin-Chu (TW)

( * ) Notice: Subject to any disclaimer, the term of this patent is extended or adjusted under 35 U.S.C. 154(b) by 401 days.

(21) Appl. No.: 12/414,679

(22) Filed: Mar. 31, 2009

(65) Prior Publication Data
US 2010/0046178 A1   Feb. 25, 2010

(30) Foreign Application Priority Data

Aug. 22, 2008   (CN) .......................... 2008 1 0144581

(51) Int. Cl.
*G02F 1/1333* (2006.01)
(52) U.S. Cl. ............. 349/58; 349/56; 361/829; 361/600
(58) Field of Classification Search ............. 349/58–60, 349/56; 174/50, 250, 545, 520; 361/752, 361/829, 600, 679.01–679.03
See application file for complete search history.

(56) References Cited

U.S. PATENT DOCUMENTS

| | | | | |
|---|---|---|---|---|
| 5,666,172 A * | 9/1997 | Ida et al. | | 349/58 |
| 6,175,396 B1 * | 1/2001 | Kim et al. | | 349/58 |
| 6,295,103 B1 * | 9/2001 | Yamatani et al. | | 349/58 |
| 6,392,723 B1 | 5/2002 | Sugiyama | | |
| 6,411,353 B1 * | 6/2002 | Yarita et al. | | 349/59 |
| 6,812,976 B2 | 11/2004 | Satonaka | | |
| 6,828,721 B2 * | 12/2004 | Wakita | | 313/491 |
| 7,275,852 B2 * | 10/2007 | Kim et al. | | 362/612 |
| 7,551,458 B2 * | 6/2009 | Carnevali | | 361/807 |
| 7,626,654 B2 * | 12/2009 | Tsubokura et al. | | 349/60 |
| 7,940,287 B2 * | 5/2011 | Kim et al. | | 345/102 |

FOREIGN PATENT DOCUMENTS

| | | |
|---|---|---|
| CN | 1188903 A | 7/1998 |
| CN | 1904681 A | 1/2001 |
| CN | 2646739 Y | 10/2004 |
| CN | 1567040 A | 1/2005 |
| JP | 2000-314872 A | 11/2000 |

* cited by examiner

*Primary Examiner* — Angel R Estrada
*Assistant Examiner* — Dimary Lopez
(74) *Attorney, Agent, or Firm* — CKC & Partners Co., Ltd.

(57) ABSTRACT

The invention is related to a flat panel display, comprising a panel, a first frame body and a second frame body. The first frame body has a U-shaped fastening member with at least an opening on one sidewall thereof. The second frame body is concaved a first recess corresponding to the U-shaped fastening member. The first recess has at least a protrusion on one sidewall thereof and the protrusion corresponds to the opening. Therefore, when the protrusion is pressed into the opening and then the U-shaped fastening member is wedged in the first recess, the first frame body and the second frame body are fixed together and thus the panel between the first frame body and the second frame body can be fastened tightly without using fastening bolts and soldering art.

16 Claims, 5 Drawing Sheets

FLAT PANEL DISPLAY WITH U-SHAPED FASTENING MEMBER

RELATED APPLICATIONS

This application claims priority to China Application Serial Number 200810144581.0, filed Aug. 22, 2008, which is herein incorporated by reference.

BACKGROUND

1. Field of Invention

The present invention relates to a flat panel display, more particularly to a flat panel display for easy assembly.

2. Description of Related Art

Refer to FIG. 1. FIG. 1 is a transverse cross-sectional schematic view of a conventional flat panel display. The conventional flat panel display 500 is fabricated with a front frame 501, a rear frame 502 and a display panel 503, in which the display panel 503 is sandwiched between the front frame 501 and the rear frame 502 when the front frame 501 and the rear frame 502 are combined together. Usually, the front frame 501 and the rear frame 502 are combined together with fastening bolts 504 to clamp the display panel 503, and for clamping a larger panel, more fastening bolts 504, arranged equidistantly thereon to securely hold the display panel 503, are needed.

As mentioned above, it is time-consuming to combine the front frame 501 and the rear frame 502 with fastening bolts 504 sequentially after the display panel 503 has been placed between the front frame 501 and the rear frame 502. Also, preparing and storing fastening bolts 504 increases material cost and management cost.

In order to save time and cost in flat panel display assembly, combining the front frame 501 and the rear frame 502 with solder operation (not shown in illustration) is chosen. Soldering the front frame 501 to the rear frame 502 can save both time and cost. An additional solder step needs to be added in the original process, and the relevant soldering equipment and solder material have to be prepared. Therefore, combining the front frame 501 and the rear frame 502 with a solder operation may save time from doing so with fastening bolts 504, but in fact, it fails to cut down the manufacturing cost.

Furthermore, some issues for a front frame being built-integrated may be raised. First, because producing the built-integrated front frame remains unusable residue from raw material, the material cost may be raised. Secondly, the package size for packing the built-integrated front frame is larger and then the equal volume use rate is lower. Therefore, the above-mentioned issues and drawbacks from the convention flat panel display are urgently to be overcome.

SUMMARY

It is therefore an aspect of the present invention to provide a flat panel display capable of easy fabrication, even when the flat panel display adopts a larger-sized LCD panel, the flat panel display still can be fabricated quickly and effectively without fastening bolts and soldering art. Thus, the manufacturing time of fabrication will be cut down greatly, and then the cost in material and manpower will be further saved.

Accordingly, a practical embodiment in the invention is to provide a flat panel display. The flat panel display comprises a panel, a first frame body and a second frame body. The first frame body has a U-shaped fastening member having at least one opening disposed on one sidewall thereof. The second frame body is concaved a first recess corresponding to the U-shaped fastening member. The first recess has at least one protrusion disposed on one sidewall thereof and the protrusion corresponds to the opening. Therefore, when the U-shaped fastening member is pressed to the first recess and the protrusion is wedged in the opening, the first frame body and the second frame body are fixed together, and the panel between the first frame body and the second frame body can be fastened tightly without using fastening bolts and soldering art.

In another practical embodiment of the present invention, an auxiliary fastener adjacent to the U-shaped fastening member is extended from an outer edge of the first frame body, and a second recess is concaved on an outer edge of the second frame body from the first recess, and the second recess corresponds to the auxiliary fastener. Therefore, when the first frame body and second frame body are combined together to fasten the panel, besides the U-shaped fastening member is wedged in the first recess, the auxiliary fastener extending and wedged in the second recess also provides greater strength to assist the combination of the first frame body and second frame body as well, and further prevent one of the first frame body or second frame body from being releasing easily.

In variations of the auxiliary fastener in this practical embodiment, the auxiliary fastener can be presented as an L-shaped fastening member. The L-shaped fastening member is adjacent to the U-shaped fastening member, and the second recess equips a cover outside an edge of the second recess to partly cover the second recess. Thus, when the first frame body and second frame body are combined together to fasten the LCD panel between the frame bodies, the L-shaped fastening member extends into the second recess and is wedged and stuck in the second recess by the cover.

Alternatively, the auxiliary fastener can be presented as a tilted prop element adjacent to the U-shaped fastening member. Thus, when the first frame body and second frame body are combined together to fasten the LCD panel between the frame bodies, the tilted prop element extends into the second recess and is wedged and stuck in an inner surface of the second recess. Such that the counterforce reacted from the second recess to the tilted prop element enhances the combination of the first frame body and second frame body together.

Furthermore, a circuit board of the LCD panel can be either placed on the second frame body out of the first recess, or in the second recess. Thus, the circuit board can be sheltered by the above auxiliary fastener of the first frame body and the second frame body.

Finally, from varied embodiments disclosed above, the present invention achieves a fabrication of the flat panel display in short time and effectiveness without using fastening bolts and soldering art. Thus, the time of fabrication will be cut down greatly, and the cost in material and manpower will be further saved.

It is to be understood that both the foregoing general description and the following detailed description are examples, and are intended to provide further explanation of the invention as claimed.

BRIEF DESCRIPTION OF THE DRAWINGS

These and other features, aspects and advantages of the present invention will become better understood with regard to the following description, appended claims and accompanying drawings where:

DESCRIPTION OF THE PREFERRED EMBODIMENTS

Figure 1:
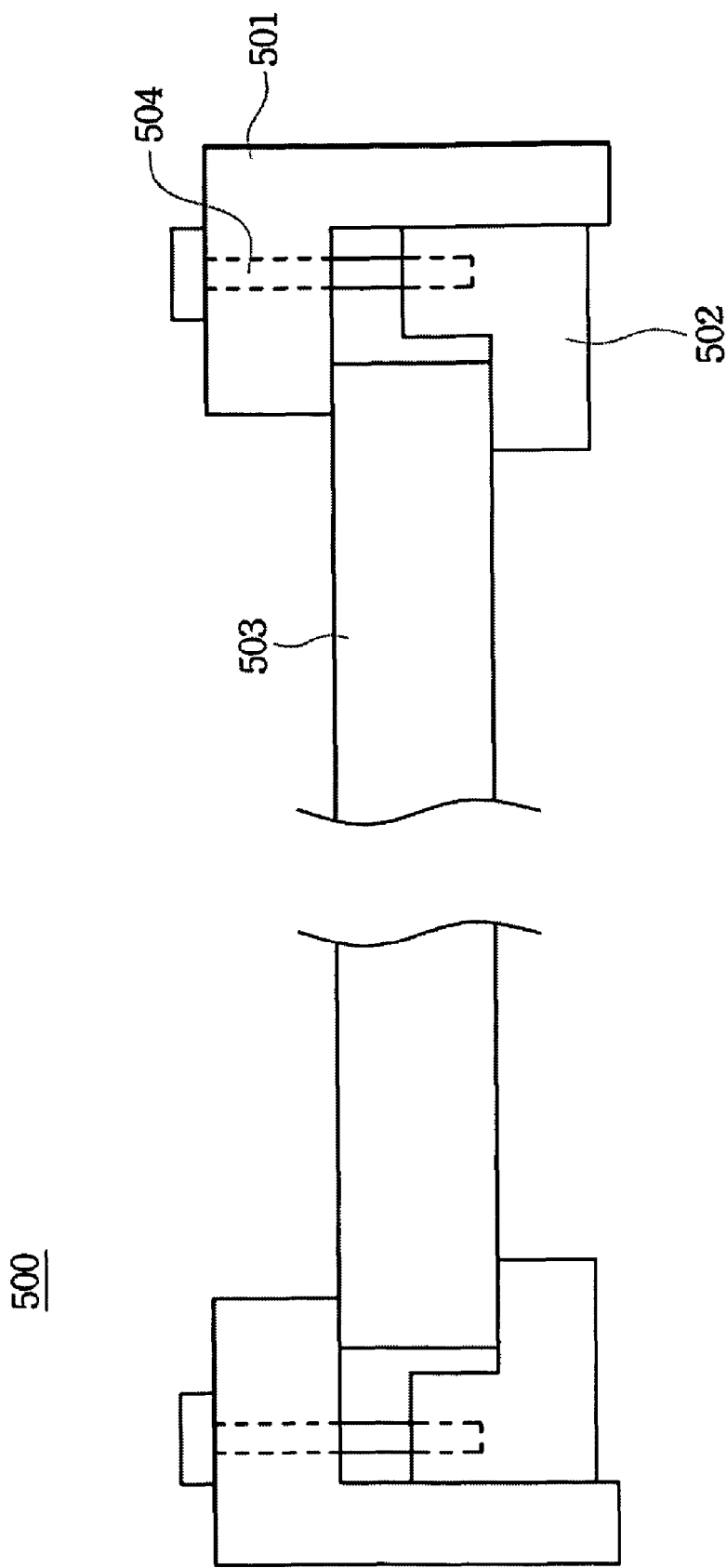
FIG. 1 is a transverse cross-sectional schematic view of a conventional flat panel display.

Reference will now be made in detail to the present preferred embodiments of the invention, examples of which are illustrated in the accompanying drawings. Wherever possible, the same reference numbers are used in the drawings and the description to refer to the same or like parts.

Figure 2:
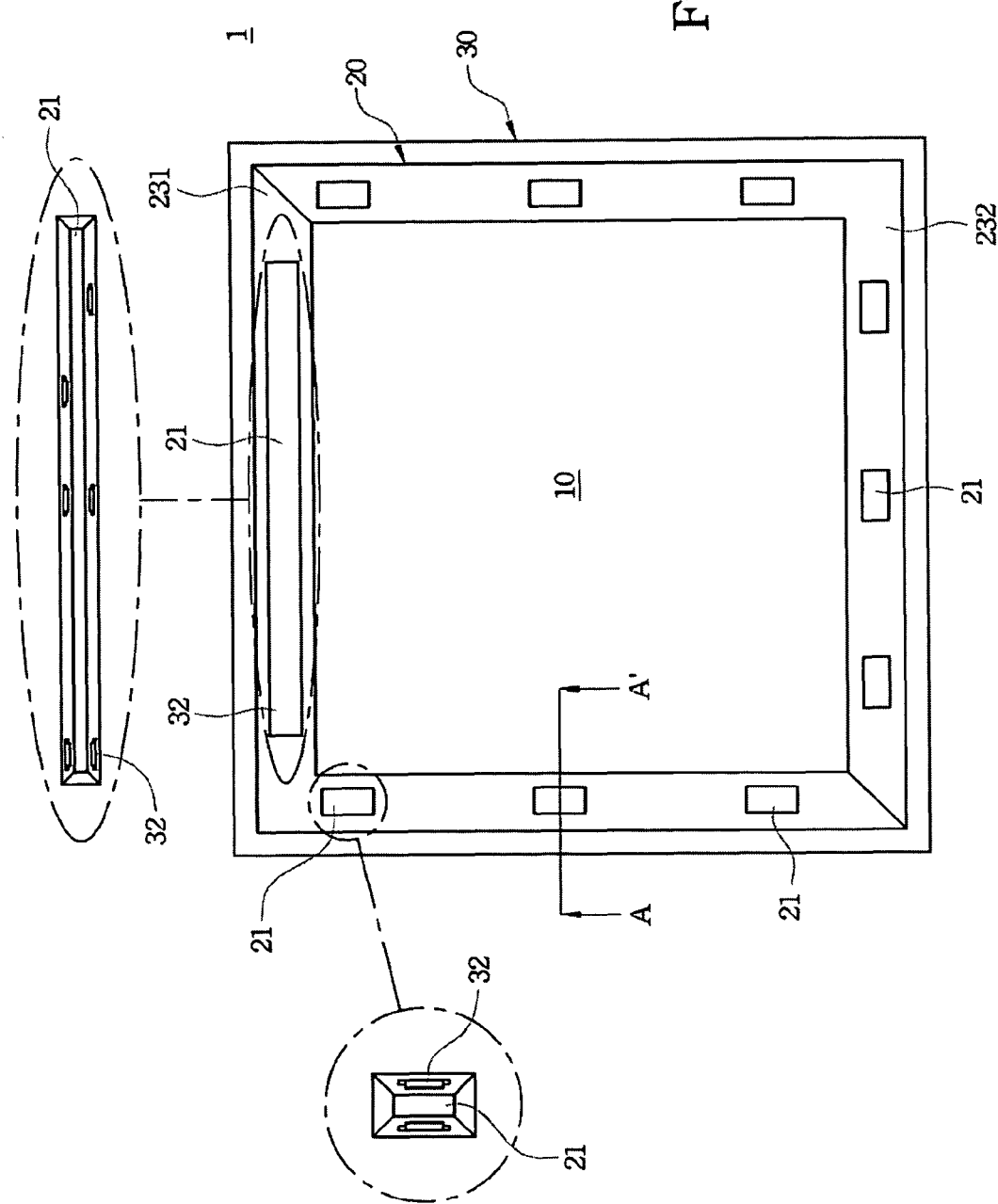
FIG. 2 is a top view of a flat panel display of the present invention.
Figure 3:
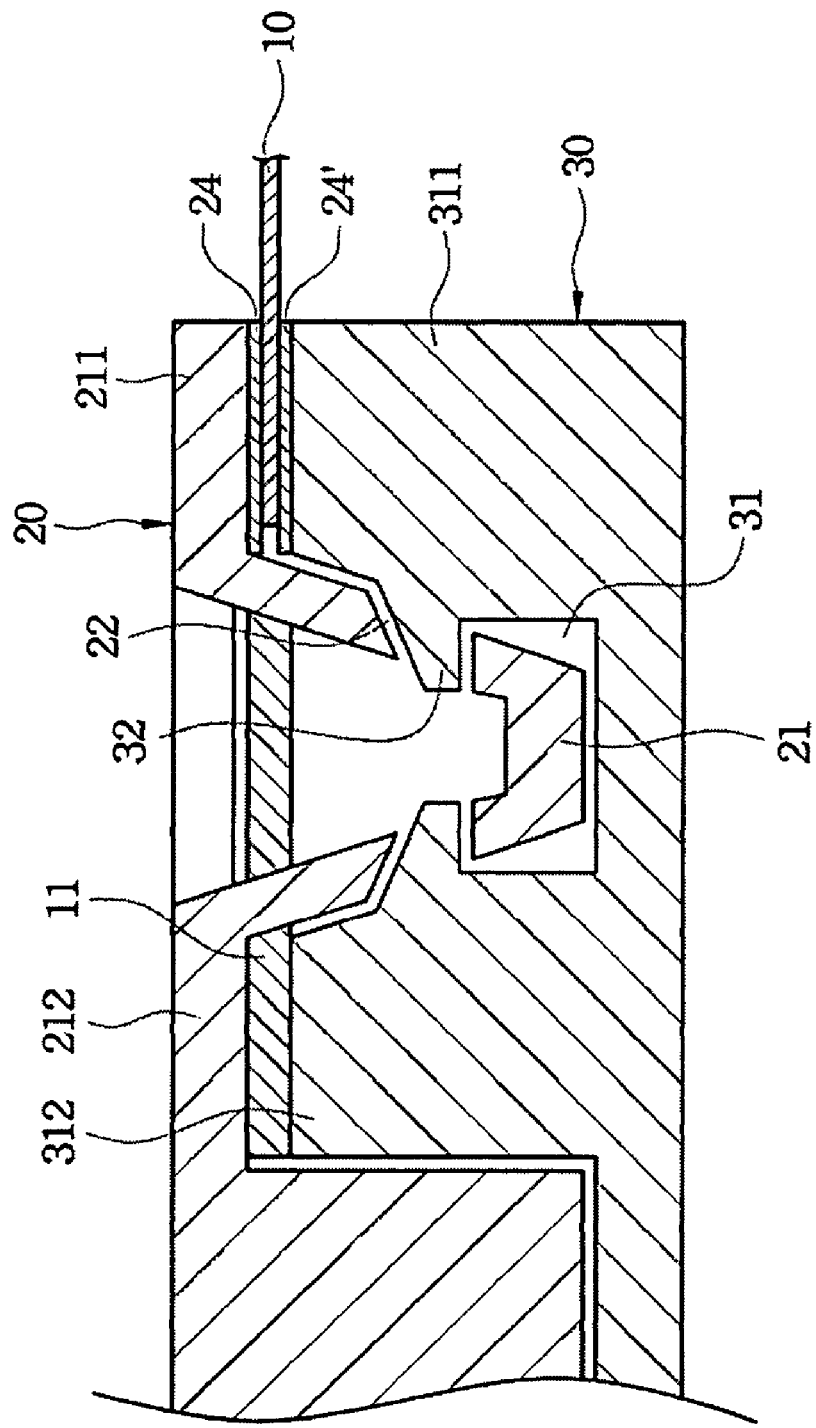
FIG. 3 is a cross-sectional view along a line A-A' in FIG. 2 of a preferred embodiment of the present invention.

Refer to FIG. 2 and FIG. 3. FIG. 2 is a top view of a flat panel display of the present invention, and FIG. 3 is a cross-sectional view along a line A-A' in FIG. 2 of a preferred embodiment of the present invention. The present invention is to disclose a flat panel display 1. The flat panel display 1 has a first frame body 20, a second frame body 30 capable of combining with the first frame body 20, and a panel 10, such as liquid crystal display panel, fastened between the first frame body 20 and the second frame body 30. A U-shaped fastening member 21 is formed on an edge of the first frame body 20 and extending towards the second frame body 30, and the U-shaped fastening member 21 has at least one opening 22 disposed on at least one sidewall of the U-shaped fastening member 21.

It is noteworthy that the quantity or the size of the U-shaped fastening member 21 in the invention depends on strength needed to securely combine the first frame body 20 and the second frame body 30 and to fasten the panel 10 between the frame bodies 20 and 30 as well.

Therefore, the U-shaped fastening member 21 can be multiple (illustrated on FIG. 2) or single to meet the needed strength. Furthermore, the U-shaped fastening member 21 is not limited to a perfect "U" shape. Shapes of a fastening member such as "Π", "V" shape or other shapes similar to a "U" shape in a cross-section also should be embraced in the invention. Moreover, according to demand in reality, the invention is allowed to is modify the shape, the bent angle, the arrangement of the openings 22, and the proportion of the fastening member.

A first recess 31 is concaved on the second frame body 30 and corresponding to the U-shaped fastening member 21. The first recess 31 is entered by the corresponding U-shaped fastening member 21. The first recess 31 has at least one protrusion 32 on at least one sidewall thereof and each protrusion 32 respectively corresponds to one opening 22. The protrusion 32 is wedged in the opening 22 to fasten the U-shaped fastening member 21 in the first recess 31.

Therefore, when the U-shaped fastening members 21 is pressed into the corresponding first recesses 31 and all of the protrusions 32 enter into its corresponding opening 22, the U-shaped fastening members 21 are wedged in the corresponding first recesses 31, and the first frame body 20 and the second frame body 30 are combined together to clamp a border of the panel 10 between the first frame body 20 and the second frame body 30. Therefore, the flat panel display can be fabricated quickly and effectively without fastening bolts and soldering art. The manufacturing time of fabrication will be cut down greatly, and then the cost in material and manpower will be further saved.

In the above embodiment, refer to FIG. 2, the first frame body 20 may be made by malleable metal material, and can be provided as an integral frame or a frame assembled by a plurality of frame units. For instance, the first frame body can be assembled with two L-shaped frame units 231 and 232 or two "Π" shaped frame units (not shown in figure). However, there is no limitation for such is above description, the invention is allowed to modify shape and quantity of the frame unit according to demand in reality. Meanwhile, when the first frame body 20 is assembled by plural frame units, a lot of unusable residue remaining from raw material can be avoided, and then to cut down the material cost, and to raise the equal volume use rate thereof as well.

Since the first frame body 20 can be made by malleable metal material, the steps of forming the U-shaped fastening members 21 and the openings 22 on the first frame body 20, can be processed as follows.

First, equidistantly concaving to form a suitable number of openings 22 at some predetermined areas of the first frame body 20. Next, through a punch stressing process on the predetermined areas of the first frame body 20 is to shape U-shaped fastening members 21 and the openings 22 are on sidewall of the U-shaped fastening members 21. Thus, the U-shaped fastening members 21 are a bulge protruding to a direction and are integral as one part of the first frame body 20.

In varieties of the positions for the openings 22 on the U-shaped fastening members 21, the openings 22 in the embodiment can be concaved symmetrically or asymmetrically on both sidewalls of the U-shaped fastening member 21. Namely, the openings 22 are arranged symmetrically or asymmetrically on the predetermined areas of the first frame body 20 before the U-shaped fastening members 21 are passed through the punch stressing process. Thus, when the openings 22 are arranged symmetrically, the openings 22 on different sidewalls of the U-shaped fastening member 21 can face with each other horizontally (see the openings 22 in FIG. 3), otherwise, when the openings 22 are arranged asymmetrically, the openings 22 on different position of the sidewalls of the U-shaped fastening member 21 are staggered and cannot face each other horizontally (see the openings 22 in FIG. 5). However, the U-shaped fastening member 21 above disclosed with its openings is one embodiment of the invention, the U-shaped fastening members and the openings of the invention are not limited to that, and can be modulated depending on needs in reality.

Furthermore, the second frame body 30 may be made by elastic plastic material and may be formed by inserting molding technology, and the protrusions 32 are symmetrically or asymmetrically formed on each sidewall of the first recess 31 in order to correspond with one of the openings 32. Namely, the protrusions 32 are respectively arranged symmetrically or asymmetrically on two opposite sidewalls of the first recess 31, and respectively corresponding to one opening 22 of the U-shaped fastening member 21. Thus, when the protrusions 32 are arranged symmetrically thereon, the protrusions 32 on different sidewalls of the first recess 31 can face each other horizontally (see the protrusions 32 in FIG. 3), otherwise, when the protrusions 32 are arranged asymmetrically thereon, the protrusions 32 are staggered on different sidewalls of the first recess 31, and cannot face each other horizontally (see the protrusions 32 in FIG. 5).

When separating the U-shaped fastening member 21 from the first recess 31, the staggered protrusions 32 leads to the small possibility that the U-shaped fastening member 21 may damage the protrusion 32 and the high possibility the U-shaped fastening member 21 and the protrusions 32 can easily be repaired. As long as the arrangement of the protrusions 32 can correspond to the arrangement of the openings 22, the shape and the number of the protrusions 32 are not limited in the invention.

Refer to FIG. 3. A first pressing portion 211 and a second pressing portion 212 are defined on an inner surface of the first frame body 20, and the U-shaped fastening member 21 is between the first pressing portion 211 and the second pressing portion 212. The first pressing portion 211 is used to press one side of the panel 10. On the other hand, a first pushing portion 311 and a second pushing portion 312 are defined on an inner surface of the second frame body 30, and the first recess 31 is between the first pushing portion 311 and the second pushing portion 312. The first pushing portion 311 is used to press another side of the panel 10.

When the first frame body 20 and the second frame body 30 are combined together, the panel 10 is fastened between the first pressing portion 211 and the first pushing portion 311 in which both the first pressing portion 211 and the first pushing portion 311 press the edge of the panel 10, and the second pressing portion 212 and the second pushing portion 312 face and contact with each other.

Furthermore, in order to prevent the panel 10 from being overly pressed between the first pressing portion 211 and the first pushing portion 311, in each of the mentioned embodiments, there may be a buffer pad 24 between the first pressing portion 211 and the side of the panel 10, and another buffer pad 24' between the first pushing portion 311 and another side of the panel 10. Here, the buffer pads 24, 24' can be made of rubber or other similar buffer material. Thus, the buffer pad 24, 24' can buffer the stress from the first pressing portion 211 and the first pushing portion 311 respectively towards the both sides of the panel 10, and can protect the panel 10 from being damaged or scratched.

Figure 4:
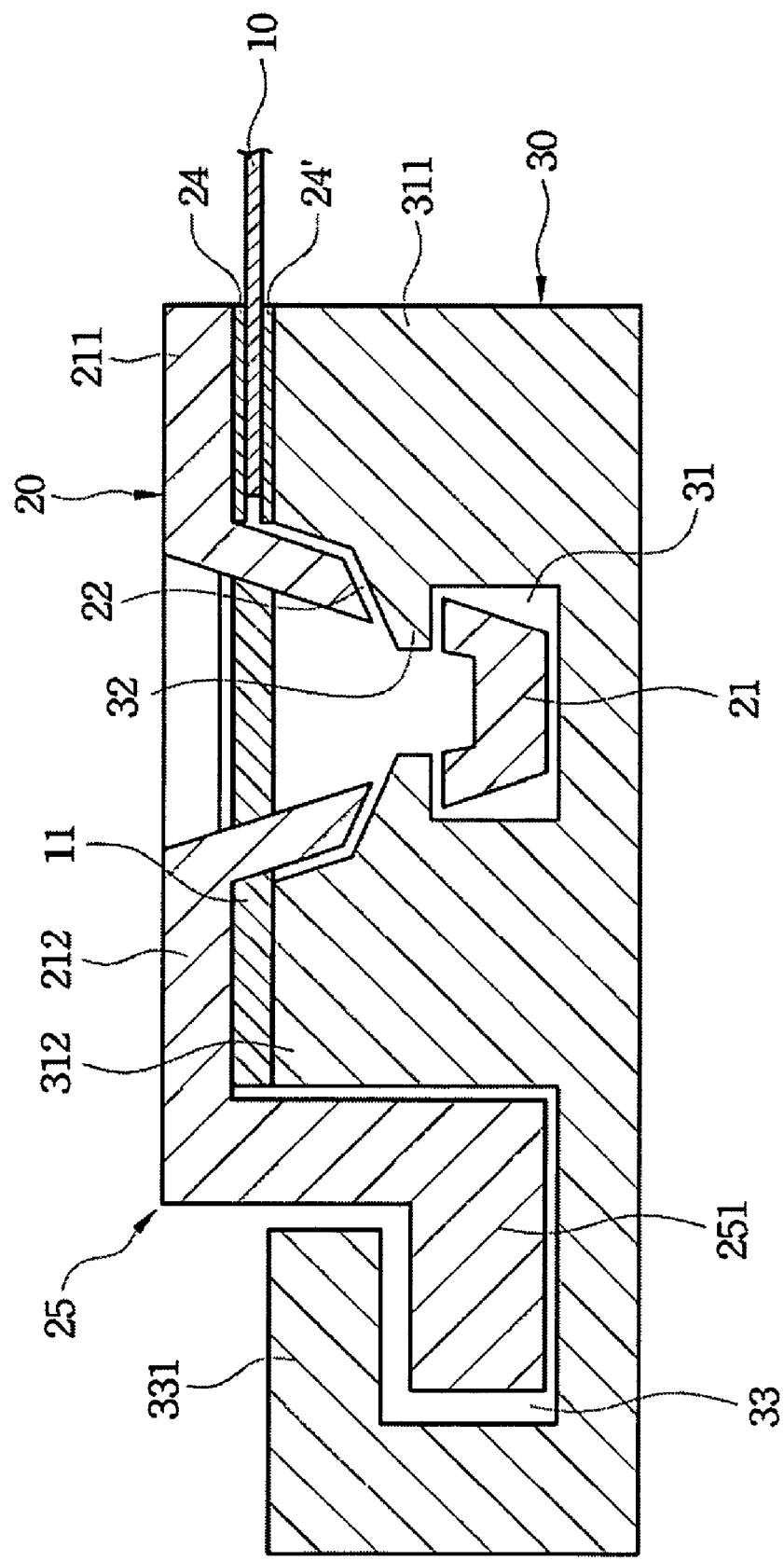
FIG. 4 is a schematic view of a first reinforcement member of an embodiment of the present invention.
Figure 5:
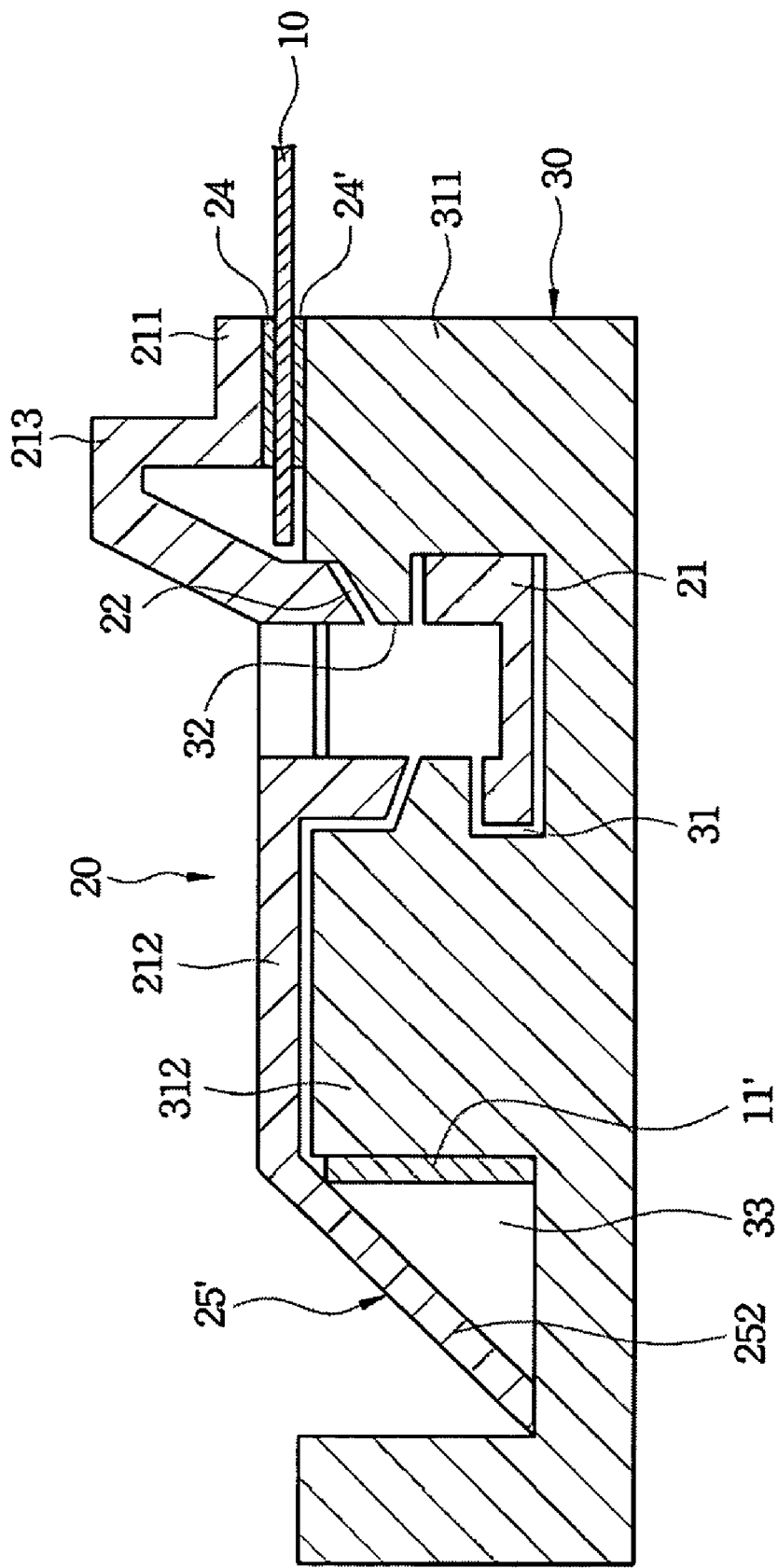
FIG. 5 is a schematic view of a second reinforcement member of another embodiment of the present invention.

Refer to FIG. 4 and FIG. 5. FIG. 4 and FIG. 5 are schematic views of reinforcement members of other embodiments. FIG. 4 and FIG. 5 show an auxiliary fastener 25 and a second recess 33. The auxiliary fastener 25 is disposed adjacently to the U-shaped fastening member 21 and is extended towards an outer edge of the first frame body 20, and the second recess 33 is disposed on an outer edge of the second frame body 30. When the first frame body 20 and the second frame body 30 are combined together, the auxiliary fastener 25 is fastened into the second recess 33 to reinforce the combination of the first frame body 20 and the second frame body 30. Therefore, besides the U-shaped fastening member 21 is wedged in the first recess 31, the auxiliary fastener 25 also is fixed into the second recess 33 to further assist the combination of the first frame body 20 and the second frame body 30 and to avoid one of the first frame body 20 or the second frame body 30 easily departing away with each other.

There are many variations of the auxiliary fastener practiced in this invention, for example, two embodiments for the auxiliary fastener 25, 25' and its corresponding second recess 33 are disclosed in the following paragraphs. However, the practice of the auxiliary fastener and its corresponding second recess are not only limited in such embodiments, and any need in reality could make the auxiliary fastener and the second recess 33 to be modified.

Refer to FIG. 4. The auxiliary fastener 25 can be a L-shaped fastening member 251 adjacent to the second pressing portion 212. There may be a cover 331 is disposed on an outer edge of the second recess 33 corresponding to the auxiliary fastener 25. The cover 331 partly covers the second recess 33.

When the first frame body 20 and the second frame body 30 are combined together to fasten the panel 10, since the L-shaped fastening member 251 and the first frame body 20 are malleable metal, the L-shaped fastening member 251 first is bent to be put into the second recess 33. After the L-shaped fastening member 251 recovers and then is wedged in the second recess 33, the U-shaped fastening member 21 is then pushed into the first recess 31, so that each protrusion 32 of the first recess 31 is entered and wedged into the corresponding opening 22. Because the L-shaped fastening member 251 is fastened in the second recess 33, the combination of the first frame body 20 and the second frame body 30 are enhanced.

Refer to FIG. 5. The auxiliary fastener 25' can be presented as a tilted prop element 252 adjacent to the second pressing portion 212, and the tilted prop element 252 is formed as a plate and may have a material as same as the first frame body 20. When the first frame body 20 and the second frame body 30 are combined together to fasten the panel 10, the tilted prop element 252 first extends into the second recess 33 and being wedged in the second recess 33 and stuck in an inner surface of the second recess 33, and then the U-shaped fastening member 21 can be pressed into the first recess 31, so that each protrusion 32 of the first recess 31 is entered and wedged into the corresponding opening 22. Because the inner surface of the second recess 33 responds reacting force to the tilted prop element 252, the combination of the first frame body 20 and the second frame body 30 is more secure to avoid the first frame body 20 easily departing away from the second frame body 30.

However, the described auxiliary fastener 25 or 25' are just optional for assistance of the combination of the first frame body 20 and the second frame body 30, not a compulsory element. Even only based on the assembly of the U-shaped fastening member 21 and the first recess 31, there is enough strength for combining the first frame body 20 and the second frame body 30.

Furthermore, in order to drive the panel 10, a PCB 11 or 11' is connected to the panel 10 via a flexible PCB (not shown in figure). Therefore, as shown in FIG. 4, the PCB 11 can be placed outside of the first recess 31 and between the first frame body 20 and the second frame body 30, in particular, the PCB 11 is placed between the second pressing portion 212 and the second pushing portion 312. Thus, the PCB 11 can be sheltered by the first frame body 20 and the second frame body 30.

Another example, as shown in FIG. 5, the PCB 11' can be placed in the second recess 33 and sheltered under the tilted prop element 252. Particularly, the PCB 11' is placed between an inner surface of the second recess 33 and the tilted prop element 252 that extending inward the second recess 33. However, those skilled in the art can modify the embodiment according to needs in reality, such as, the PCB 11' can be placed between the second pressing portion 212 and the second pushing portion 312 as well.

The flat panel display does not need to reserve extra room for the PCB 11 or 11', and the flat panel display also shelters the PCB 11 or 11' for protection and avoiding damage.

In order to enhance the strength to efficiently fasten the panel 10 between the first frame body 20 and the second frame body 30, the flat panel display further has a curved reinforcement 213. The curved reinforcement 213 is is disposed between the first pressing portion 211 and the U-shaped fastening member 21. The curved reinforcement 213 is curved-shaped and can make the first pressing portion 211 more extending towards the panel 10. Therefore, elasticity and cushion of the first pressing portion 211 for pressing the panel 10 are enhanced.

Moreover, it is allowable that the appearance of the U-shaped fastening members 21 in FIG. 4 and FIG. 5 is not exactly the same, In other words, a fastening member may have a similar section appearance, such as U-shaped section, V-shaped section, U-shaped section. And the fastening member is still in the scope or spirit of the invention.

To sum up, due to features of the elements and the combinations described in the first frame body and second frame body, the first frame body and the second frame body achieve to combine together and strongly fasten the panel without the known fastening bolts and soldering art. Thus, the manufacturing time of fabrication will be cut down greatly, and then the cost in material and manpower will be further saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flat panel display comprising:
   a first frame body having a U-shaped fastening member and a pressing portion, wherein the U-shaped fastening member is with at least one opening disposed on at least one sidewall of the U-shaped fastening member, and the pressing portion is disposed on an inner surface of the first frame body;
   a second frame body having a first recess and a pushing portion, wherein the first recess is corresponding to the U-shaped fastening member, and the first recess having at least one protrusion disposed on at least one sidewall of the first recess and the protrusion corresponding to the opening, and the pushing portion disposed on an inner surface of the second frame body;
   a panel fastened between the first frame body and the second frame body when the U-shaped fastening member is pressed to the first recess and the protrusion is wedged in the opening, wherein the pressing portion presses one side of the panel, and the pushing portion presses another side of the panel; and
   a curved reinforcement disposed between the pressing portion and the U-shaped fastening member, and the curved reinforcement used for enhancing the pressing portion to press the panel.

2. The flat panel display of claim 1, wherein two sidewalls of the U-shaped fastening member have one opening each and two sidewalls of the first recess have one protrusion each, and the protrusions respectively correspond to the openings.

3. The flat panel display of claim 2, wherein the openings are staggered on the sidewalls of the U-shaped fastening member, and the protrusions are staggered on the sidewalls of the first recess.

4. The flat panel display of claim 1, wherein the U-shaped fastening member includes a malleable metal material.

5. The flat panel display of claim 1, wherein the U-shaped fastening member is a bulge formed by punching the first frame body.

6. The flat panel display of claim 1, wherein the flat panel display further comprises a buffer pad disposed between the pressing portion and the panel, and the flat panel display further comprises another buffer pad disposed between the pushing portion and the panel.

7. The flat panel display of claim 1, wherein the flat panel display further comprises a circuit board electrically connected to the panel and the circuit board is sheltered by the first frame body and the second frame body.

8. The flat panel display of claim 1, wherein the second frame body includes an elastic plastic material.

9. The flat panel display of claim 1, wherein the second frame body further comprises a second recess and the first frame body further comprises an auxiliary fastener fastened into the second recess.

10. The flat panel display of claim 9, wherein the second recess has a cover partly covering the second recess.

11. The flat panel display of claim 10, wherein the auxiliary fastener is a L-shaped fastening member adjacent to the U-shaped fastening member, and the L-shaped fastening member is wedged in the second recess and covered by the cover.

12. The flat panel display of claim 9, wherein the auxiliary fastener is a tilted prop element adjacent to the U-shaped fastening member, and the tilted prop element is wedged in the second recess and stuck in an inner surface of the second recess.

13. The flat panel display of claim 1, wherein the first frame body comprises a plurality of frame units.

14. The flat panel display of claim 9, wherein the flat panel display further comprises a circuit board electrically connected to the panel, and the circuit board is in the second recess and sheltered by the first frame body and the second frame body.

15. A flat panel display comprising:
    a first frame body comprising:
       a U-shaped fastening member provided with at least one opening disposed on at least one sidewall of the U-shaped fastening member; and
       a tilted prop element being adjacent to the U-shaped fastening member;
    a second frame body comprising:
       a first recess corresponding to the U-shaped fastening member, and the first recess having at least one protrusion disposed on at least one sidewall of the first recess and the protrusion corresponding to the opening; and
       a second recess corresponding to the tilted prop element, for receiving the tilted prop element being stuck therein, wherein the tilted prop element in the second recess presses against an intersection of two neighboring inner surfaces of the second recess; and
    a panel fastened between the first frame body and the second frame body when the U-shaped fastening member is pressed to the first recess and the protrusion is wedged in the opening.

16. A flat panel display comprising:
    a first frame body having a U-shaped fastening member with at least one opening disposed on at least one sidewall of the U-shaped fastening member;
    a second frame body having a first recess and a second recess, wherein the first recess is corresponding to the U-shaped fastening member, and the first recess comprises at least one protrusion disposed on at least one sidewall of the first recess, and the protrusion is corresponding to the opening;
    a panel fastened between the first frame body and the second frame body when the U-shaped fastening member is pressed to the first recess and the protrusion is wedged in the opening; and
    a circuit board electrically connected to the panel, and disposed in the second recess and sheltered by the first frame body and the second frame body.

* * * * *